United States Patent
Honkura et al.

(10) Patent No.: US 8,610,427 B2
(45) Date of Patent: Dec. 17, 2013

(54) MAGNETO-SENSITIVE WIRE, MAGNETO-IMPEDANCE ELEMENT AND MAGNETO-IMPEDANCE SENSOR

(75) Inventors: Yoshinobu Honkura, Aichi (JP); Michiharu Yamamoto, Aichi (JP); Norihiko Hamada, Aichi (JP); Akihiro Shimode, Aichi (JP)

(73) Assignee: Aichi Steel Corporation, Aichi (JP)

( * ) Notice: Subject to any disclaimer, the term of this patent is extended or adjusted under 35 U.S.C. 154(b) by 469 days.

(21) Appl. No.: 12/736,298

(22) PCT Filed: Mar. 25, 2009

(86) PCT No.: PCT/JP2009/001316
§ 371 (c)(1),
(2), (4) Date: Dec. 10, 2010

(87) PCT Pub. No.: WO2009/119081
PCT Pub. Date: Oct. 1, 2009

(65) Prior Publication Data
US 2011/0080164 A1    Apr. 7, 2011

(30) Foreign Application Priority Data
Mar. 28, 2008 (JP) ................. 2008-085878

(51) Int. Cl.
*G01R 33/02* (2006.01)
(52) U.S. Cl.
USPC ........................................ 324/244
(58) Field of Classification Search
USPC ........................................ 324/244
See application file for complete search history.

(56) References Cited

U.S. PATENT DOCUMENTS

| | | | |
|---|---|---|---|
| 6,833,941 B2 * | 12/2004 | Iwatsuka | 359/283 |
| 7,224,161 B2 | 5/2007 | Honkura et al. | |
| 2002/0018916 A1 * | 2/2002 | Shinjo | 428/694 ML |
| 2006/0038561 A1 | 2/2006 | Honkura et al. | |
| 2007/0247901 A1 | 10/2007 | Akinaga et al. | |

FOREIGN PATENT DOCUMENTS

| | | |
|---|---|---|
| EP | 1146346 A1 | 10/2001 |
| EP | 1528402 A1 | 5/2005 |
| JP | 07-181239 A | 7/1995 |
| JP | 2002-374016 A | 12/2002 |
| JP | 2004-363350 A | 12/2004 |
| JP | 2005-062000 A | 3/2005 |

(Continued)

OTHER PUBLICATIONS

Communication from European Patent Office for application No. 09724160.8-222 dated Dec. 28, 2011.

(Continued)

*Primary Examiner* — Reena Aurora
(74) *Attorney, Agent, or Firm* — Rader, Fishman & Grauer PLLC

(57) ABSTRACT

The magneto-sensitive wire of the invention has a vortex-spin structure and hence includes no magnetic domain walls, so that the magneto-sensitive wire of the invention has an excellent hysteresis characteristic exhibiting nearly zero hysteresis. Therefore, the linearity related to the output voltage characteristic for the applied magnetic field in the determination range of an MI sensor is significantly improved as compared to MI sensors using the conventional magneto-sensitive wires. Using the magneto-sensitive wire of the invention makes it possible to provide a magneto-impedance (MI) element exhibiting a higher precision than the conventional ones and further provide a sensor using such an MI element.

12 Claims, 5 Drawing Sheets

(56) References Cited

FOREIGN PATENT DOCUMENTS

| | | |
|---|---|---|
| JP | 2006-300906 A | 11/2006 |
| JP | 2009-031263 A | 2/2009 |
| WO | WO-2005/019851 A1 | 3/2005 |
| WO | WO-2009/001951 A1 | 12/2008 |

OTHER PUBLICATIONS

Rakhmanov A.A., et al., "Study of Surface Magnetic Structure in Co-based Amorphous Microwaves by Means of Off-Diagonal Magnetoimpedance Effect", Journal of Magnetism and Magnetic Materials, Elseview Science Publishers, vol. 300, No. 1, May 1, 2006, E37-E40.

Phan, et al., "Giant Magnetoimpedance Materials: Fundamentals and Applications", Progress in Materials Science, vol. 53, No. 2, Feb. 1, 2008, 323-420.

Y. Honkura et al., "MI Sensor-based Electronic Compass for Mobile Phone Applications", vol. 27, No. 11, Edition No. 190, pp. 1063-1068, The Magnetics Society of Japan, (Nov. 1, 2003).

Kaneo Mouri, "Jisedai Sensor Handbook," first edition, pp. 240-247 (Chapter 5.6 "MI sensor"), Baufukan Co., Ltd., Jul. 8, 2008 (partial translation of chapter 5.6.6 is attached).

* cited by examiner (a)

(b)

(a)

(b)

SURFACE
LAYER PORTION 91
CORE PORTION 92

US 8,610,427 B2

MAGNETO-SENSITIVE WIRE, MAGNETO-IMPEDANCE ELEMENT AND MAGNETO-IMPEDANCE SENSOR

TECHNICAL FIELD

The present invention relates to a magneto-sensitive wire having good hysteresis characteristics, and a magneto-impedance element (hereinafter referred to as an "MI element") or a magneto-impedance sensor (hereinafter referred to as an "MI sensor") employing the magneto-sensitive wire.

BACKGROUND ART

When high-frequency pulse current is applied to an amorphous wire comprising a Co—Fe—Si—B alloy, wire impedance varies depending on a magnetic field due to the skin effect. This is a known phenomenon called the magneto-impedance effect (hereinafter referred to as the "MI effect"). A high-sensitive magnetic sensor using an MI element, which detects this variation by a detection coil wound around the amorphous wire, namely, an MI sensor is now used in a cell phone or the like. However, conventional MI sensors have a problem of poor hysteresis characteristics. This problem is caused by magnetic domain structure of the amorphous wire serving as a magneto-sensitive wire.

An example of magneto-sensitive wires used in conventional MI sensors is disclosed in Domestic Re-Publication of PCT International Application No. WO2005/019851. This publication discloses a tension-annealed amorphous wire of 20 μm in diameter and an MI element of not more than 1 mm in length and 0.5 mm in height employing this wire. The amorphous wire disclosed in this publication, however, has large hysteresis characteristics of about 2%.

A perspective view schematically showing magnetic domain structure within an amorphous wire constituting such a conventional magneto-sensitive wire is shown in FIG. 6. The magneto-sensitive wire 9 is divided into two layers of a surface layer portion 91 and a core portion 92 by a difference in magnetic domain structure. In the surface layer portion 91, spins are oriented in a certain circumferential direction. Therefore, the spins as a whole are closed as circumference and as a result, no magnetic domain wall exists in the surface layer portion 91.

On the other hand, the core portion 92, which lies inside the surface layer portion 91, has a multi-magnetic domain structure and a lot of magnetic domain walls exist in the core portion 92. In addition, magnetic domain walls exist in a boundary between the surface layer portion 91 and the core portion 92, because the direction of respective spins discontinuously varies.

Since, as discussed above, the surface layer portion 91 has a spin structure (alignment) in which spins are oriented in a certain circumferential direction but the core portion 92 has the multi-magnetic domain structure, the conventional magneto-sensitive wire 9 as a whole has a magnetically composite structure. The magnetic domain walls existing in the multi-magnetic domain structure of the core portion 92 and those existing in the boundary between the surface layer portion 91 and the core portion 92 has caused degradation of the hysteresis characteristics of the magneto-sensitive wire 9 or a sensor employing the same.

CITATION LIST

Patent Literature

[PTL 1]: Domestic Re-Publication of PCT International Application No. WO2005/019851

SUMMARY OF INVENTION

Technical Problem

The present invention relates to a magneto-sensitive wire having good hysteresis characteristics which is suitable for magnetic sensors and the like, and an MI element or an MI sensor employing the same.

Solution to Problem

Hysteresis phenomena occur because magnetic domain walls within a magneto-sensitive wire having a multi-magnetic domain structure move upon application of a magnetic field. Hence, the present inventors have come up with an idea of changing the multi-magnetic domain structure having magnetic domain walls with a vortex spin structure having no magnetic domain wall, and have succeeded in obtaining a magneto-sensitive wire having a vortex spin structure for the first time. Extending this achievement, the present inventors have completed the following aspects of the present invention.

<<Magneto-Sensitive Wire>>

(1) A magneto-sensitive wire of the present invention is characterized by having a vortex spin structure.

The "vortex spin structure" mentioned herein means a structure having a continuous spin alignment in which respective spins in a wire surface layer portion are continuously aligned in a certain circumferential direction, those in an inner portion inside the surface layer portion gradually rotate from the circumferential direction to an axial direction as they approach a center of the amorphous wire, and those at the wire center are oriented in the axial direction. It should be noted that a "spin" mentioned herein means magnetic moment per atom. The vortex spin structure may comprise the structure of the inner portion alone. A region which the inner portion occupies may increase or decrease depending on wire composition, internal stress and shape.

(2) FIG. 1 is a perspective cross-sectional view schematically showing a magneto-sensitive wire having a vortex spin structure. While a cross section A is a plane perpendicular to an axial direction of the wire, a cross section B is a plane cut along an axial centerline of the wire.

The magneto-sensitive wire 1 comprises two layers of a surface layer portion 11 and an inner portion 12 having different spin alignments. First, the surface layer portion 11 will be described. In the surface layer portion 11 of the cross section A, spins are oriented in a certain circumferential direction. Therefore, the spins as a whole are continuously aligned and closed (circulated or refluxed) in the circumferential direction, so no magnetic domain wall exists in the surface layer portion 11. Respective spins existing in a region X1-X2-X3-Y1 (indicated by line X1-X5 as a typical example in FIG. 1) of the cross section B constituting the surface layer portion 11 have the same alignment as those of an outermost surface of the surface layer portion 11.

Next, spin alignment of the inner portion 12 will be described. In a region Y1-X3-X6-Y3 (indicated by line X5-X6 as a typical example in FIG. 1) of the cross section B, spins existing in a boundary (X5) between the surface layer portion 11 and the inner portion 12 are oriented in the same direction as those in the surface layer portion 11. As spins go from X5 to X6, that is, approach the axial center, the direction of the spins is gradually slanted from the circumferential direction to the axial direction, so that the direction of the spins at the axial center (X6) coincides with the axial direction (a centerline direction of the magneto-sensitive wire 1). Such spin slanting alignment also exists on line Y1-Y2 of the section B or in any portion of the region Y1-X3-X6-Y3 of the cross section B.

In this way, no magnetic domain wall exists in the inner portion 12 of the magneto-sensitive wire 1 according to the present invention. Similarly, the spins are continuously aligned and no magnetic domain wall exists in the boundary between the surface layer portion 11 and the inner portion 12. Such spin alignment as a whole is called a "vortex spin structure" in the present invention. It should be noted that "spin alignment" mentioned in the description of the present invention mainly means distribution condition of magnetic moment of respective spins, but the "spin alignment" is sometimes simply referred to as "spins".

(3) The magneto-sensitive wire of the present invention is, for example, used in an MI sensor. Outlines of the MI sensor are as follows:

All spins are slanted in the direction of an applied magnetic field, in accordance with the magnitude of the applied magnetic field. When pulse current is passed through a magneto-sensitive wire, a magnetic field is formed in a circumferential direction of the magneto-sensitive wire by the pulse current and the spins in the magneto-sensitive wire are made to orient in the circumferential direction. An MI sensor detects this rotational change in the direction of the spins of the magneto-sensitive wire by a pick-up coil, or detects a variation in wire impedance.

<<Additional Constitution of Magneto-Sensitive Wire>>

Additional constitution which further embodies the present invention will be described. It should be noted that the following description is appropriately applied not only to the magneto-sensitive wire according to the present invention but also to an MI element or an MI sensor employing the same. The magneto-sensitive wire of the present invention can be constituted by adding one or more constituent features arbitrarily selected from the followings to the abovementioned constitution. Which embodiment is best depends on application target, required performance and so on.

(1) The thickness of the inner portion ("d" of the inner portion 11 in FIG. 1) can be increased to a radius of the wire at the maximum.

The vortex spin structure of the present invention is not a two-dimensional structure such as a thin film in the field of nanodots, but a three-dimensional structure. This three-dimensional vortex spin structure is disclosed by the present invention for the first time.

Unlike a conventional three-dimensional structure about which not only rotation of spins but also movement of magnetic domain walls are detected, the vortex spin structure of the present invention does not have any magnetic domain wall or magnetic domain. Therefore, the MI sensor of the present invention can detect absolutely only rotation of spins and has a good effect of zero hysteresis. Hence, the present invention can also be said as a magneto-sensitive wire having no magnetic domain wall or magnetic domain.

Moreover, it is preferable that the magneto-sensitive wire of the present invention comprises a soft magnetic alloy whose main phase is amorphous and which has zero magnetostriction. This makes it possible to obtain a magneto-sensitive wire having a vortex spin structure or a magneto-sensitive wire having no magnetic domain wall or magnetic domain.

"Zero magnetostriction" mentioned herein means that an absolute value of magnetostriction is less than $10^{-6}$. For example, on page 13 of "*Jiki Sensa Rikougaku* (Magnetic Sensor Technology)" published by Corona Publishing Co. Ltd. in Japan, there is a description "When Fe/Co of $(CoFe)_{80}(SiB)_{20}$ is about 0.07, an absolute value of magnetostriction is less than $10^{-6}$, and this level of magnetostriction is defined as zero magnetostriction." Accordingly, this level is also defined as zero magnetostriction in the present invention, as mentioned above.

Preferably, the magneto-sensitive wire of the present invention comprises a Co—Si alloy, and more preferably a Co—Si—B alloy, and especially more preferably a Co—Fe—Si—B alloy which all have zero magnetostriction. In addition to these, the magneto-sensitive wire of the present invention can comprise a known amorphous alloy such as a Co—Mn—Si—B alloy and a Fe—Si alloy.

(2) An example of methods for producing a magneto-sensitive wire having a vortex spin structure will be shown below.

This magneto-sensitive wire is produced, for example, by suitably controlling alloy components, wire diameter and internal stress. An alloy to be used is preferably a Co—Fe—Si—B alloy material having zero magnetostriction.

With an increase in wire diameter, formation of a vortex spin structure becomes more difficult. When the diameter exceeds 15 μm, a multi-magnetic domain structure is easily formed inside the magneto-sensitive wire. Therefore, it is desirable that the wire diameter is not more than 15 μm.

Furthermore, when the wire diameter is less than 0.5 μm, the volume of the wire decreases and sensor sensitivity deteriorates such that the wire is difficult to function as a sensor. Therefore, it is preferable that the magneto-sensitive wire of the present invention has a diameter of, for example, 0.5 to 15 μm.

Internal stress is controlled, for example, by applying thermal treatment to the wire with a tension applied (hereinafter referred to as "tension annealing"), applying thermal treatment to the wire with an electric current passed through. These thermal treatments are applied below a temperature at which the amorphous phase is completely changed into the crystalline phase.

<<MI Element>>

(1) The present invention is also a magneto-impedance element using the abovementioned magneto-sensitive wire having a vortex spin structure as a magnetic detector. The present invention can also be grasped as a magneto-impedance element using the magneto-sensitive wire having no magnetic domain wall or magnetic domain as a magnetic detector.

The MI element of the present invention can be just what is prepared by replacing only a magneto-sensitive wire serving as a magnetic detector with the abovementioned magneto-sensitive wire of the present invention in a known conventional MI element.

The very constitution of an MI element is known, for example, in International Publication Nos. WO2003/071299 and WO2005/019851, and Japanese Unexamined Patent Publication Nos. 2005-227297 and H07-181239. Known constitution of these publications and other known constitutions are applicable to the MI sensor of the present invention.

The MI element of the present invention includes, for example, a substrate, the abovementioned magneto-sensitive wire of the present invention, an insulator covering the magneto-sensitive wire, a detection coil wound around the magneto-sensitive wire, and electrode terminals extending from the magneto-sensitive wire and the detection coil.

(2) Respective spins within the magneto-sensitive wire of the MI element are slanted in the direction of an external magnetic field in accordance with the magnitude of the external magnetic field. When a high-frequency pulse current of about 50 to 250 MHz generated by a pulse oscillation circuit is supplied there, a magnetic field is formed in a circumferential direction of the magneto-sensitive wire and the spins in the magneto-sensitive wire rotate in the circumferential direction. The MI sensor detects this change in the direction of these spins by a detection coil or detects a variation in wire impedance. When the abovementioned pulse current is interrupted, similar changes occur and these changes can be detected. Upon using this MI element of the present invention in an MI sensor, the following good effects can be exhibited.

<<MI Sensor>>

(1) The present invention can be grasped not only as the magneto-sensitive wire or the MI element mentioned above but also as an MI sensor employing these.

The MI sensor of the present invention can be just what is prepared by replacing only a magneto-sensitive wire serving as a magnetic detector with the abovementioned magneto-sensitive wire of the present invention in a known conventional MI sensor. The MI sensor of the present invention comprises, for example, the magneto-sensitive wire of the present invention, a detection coil wound around the magneto-sensitive wire, a pulse oscillation circuit for applying pulse current to the magneto-sensitive wire, and a signal processing circuit for converting a voltage detected by the detection coil into a signal corresponding to the magnitude of an external magnetic field.

(2) Owing to the use of the abovementioned magneto-sensitive wire, the MI sensor of the present invention has such good hysteresis characteristics that hysteresis detected by the MI sensor is almost zero. The MI sensor of the present invention has good linearity of output voltage characteristics with respect to applied magnetic field in a measurement range.

The very constitution of an MI sensor is also known by the abovementioned publications and so on, and known constitution of those publications and other known constitutions are applicable to the MI sensor of the present invention. It should be noted that the MI sensor of the present invention can obtain similar effects also by directly detecting a variation in impedance of the magneto-sensitive wire.

Advantageous Effects of Invention

As mentioned above, upon replacing a magneto-sensitive sensor of a conventional MI element or MI sensor with the magneto-sensitive wire of the present invention having a vortex spin structure, the MI element or the MI sensor of the present invention exhibits such good hysteresis characteristics that hysteresis detected by the MI sensor is almost zero.

Furthermore, an MI sensor using the magneto-sensitive wire of the present invention is greatly improved in linearity of output voltage characteristics with respect to applied magnetic field in a measurement range when compared to an MI sensor using a conventional magneto-sensitive wire.

Figure 1:
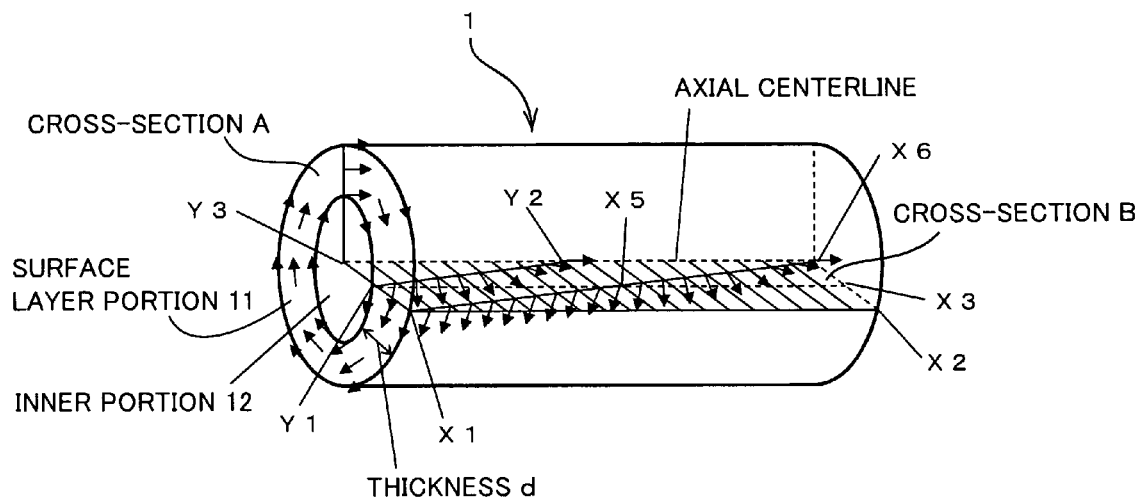
FIG. 1 is a perspective cross-sectional view schematically showing a vortex spin structure of a magneto-sensitive wire according to the present invention.

REFERENCE SIGNS LIST 1 a magneto-sensitive wire (an example)
11 a surface layer portion
12 an inner portion
2 an MI element
3 a detection coil
4 an insulator
51 electrodes
52 electrodes
6 an MI sensor
61 a pulse oscillation circuit
62 a signal processing circuit
7 pulse current waveform
9 a magneto-sensitive wire (a conventional example)
91 a surface layer portion
92 a core portion
10 a substrate

DESCRIPTION OF EMBODIMENTS

Embodiments of the present invention will be described in comparison with a conventional example, when appropriate. It should be noted that the present invention is not limited to the following examples.

<<Constitution>>

(1) Magneto-Sensitive Wire

An amorphous wire of 11.6 μm in diameter having an alloy composition of $Co_{71.2}Fe_{4.8}Si_{11.8}B_{12.2}$ (at %) and produced by an improved Taylor method was used as a specimen material of a magneto-sensitive wire according to an example of the present invention. This amorphous wire serving as a specimen material was subjected to thermal treatment for 7 seconds at an atmosphere temperature of 520 deg. C. with a tension of 200 MPa applied (Example 1).

Figure 6:
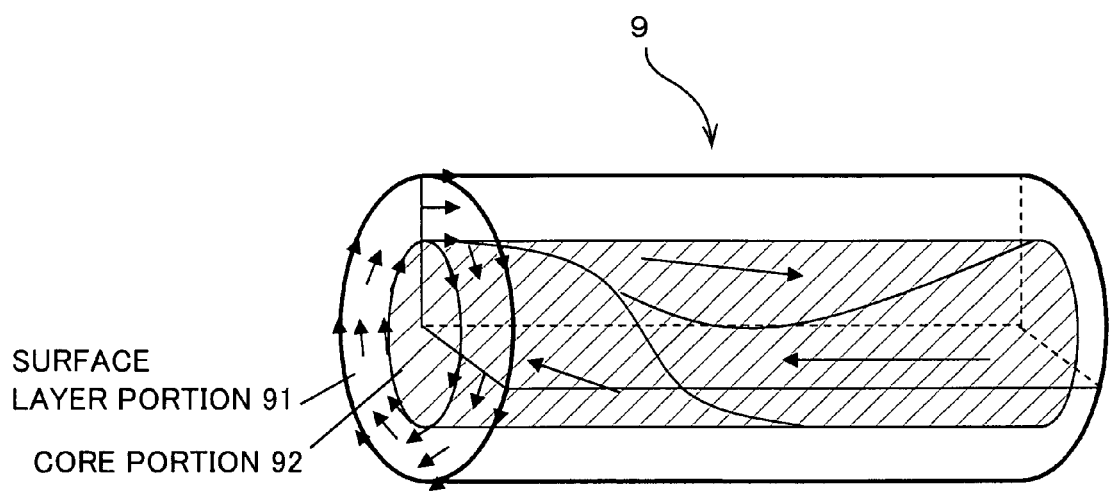
FIG. 6 is a perspective view schematically showing a magnetic composite structure within a magneto-sensitive wire of a conventional example.

Also prepared, as a conventional example, was an amorphous wire having a spin structure in which spins are aligned in a certain circumferential direction in a surface layer portion like the surface layer portion 91 in FIG. 6, and a multi-magnetic domain structure in an inner portion (produced by UNITIKA Ltd.). This amorphous wire was produced by an in-rotating-liquid spinning process and had an alloy composition of $(Co_{94}Fe_6)_{72.5}Si_{12.5}B_{15}$ (at %) and a diameter of 20 μm and was subjected to tension annealing.

Another amorphous wire having a reduced diameter of 13 μm was also prepared by etching the abovementioned amorphous wire used as the conventional example (Example 2).

(2) MI Element

Figure 2:
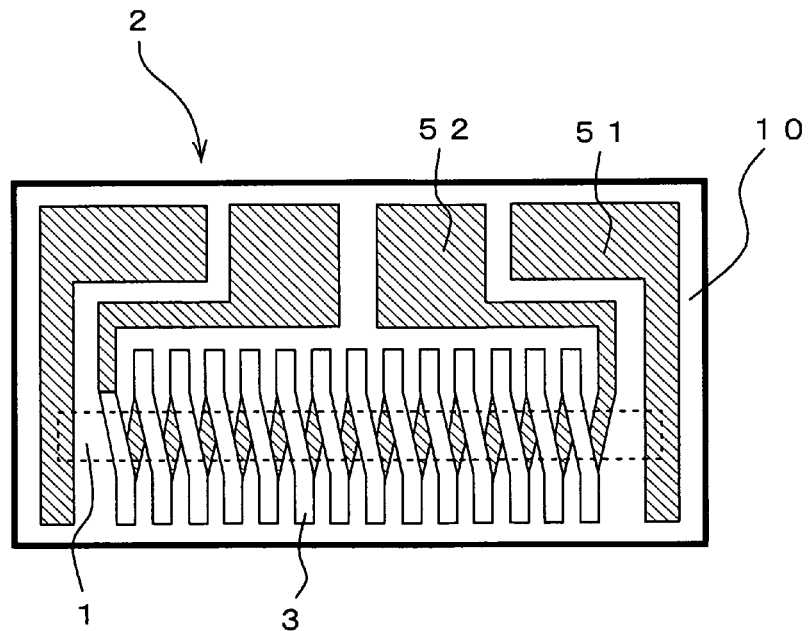
FIG. 2 is a front conceptual diagram showing an MI element of an example of the present invention.

Constitution of an MI element 2 of an example according to the present invention will be described with reference to the conceptual diagram of FIG. 2.

First, a detection coil 3 disposed around a magneto-sensitive wire 1 through an insulator 4 (not shown) is installed on a substrate 10. Both ends of the magneto-sensitive wire 1 are connected to electrodes 51 for applying pulse current. The detection coil 3 is connected to electrodes 52 for detecting a voltage which varies depending on an external magnetic field. The magneto-sensitive wire 1 has a length of 0.6 mm and the detection coil 3 has 15 coil turns. The constitution shown here is just an example and other known MI element constitutions can be employed.

(3) MI Sensor

Figure 3:
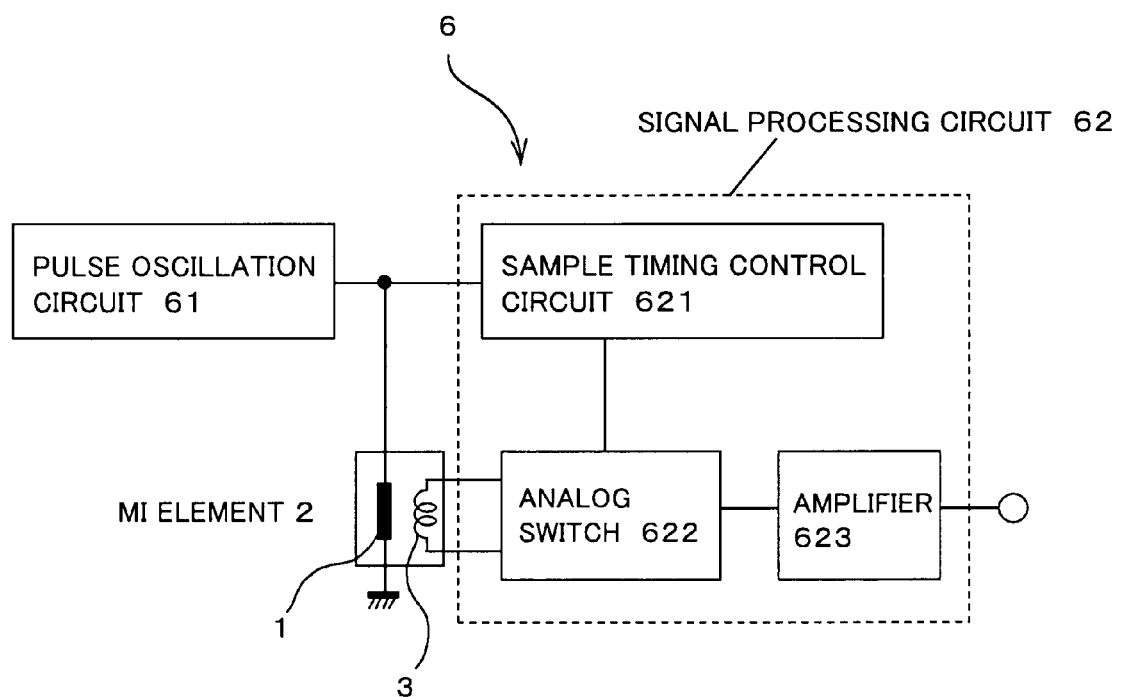
FIG. 3 is a conceptual diagram showing electric circuits of an MI sensor of an example of the present invention.

Electric circuits of an MI sensor 6 of an example according to the present invention will be described with reference to FIG. 3. The MI sensor 6 comprises the MI element 2, a pulse oscillation circuit 61, and a signal processing circuit 62. The sensor 6 operates as follows.

High-frequency pulse current of about 50 to 250 MHz generated by the pulse oscillation circuit 61 is supplied to the magneto-sensitive wire 1 in the MI element 2. Then, due to an action of an external magnetic field and a magnetic field formed by the pulse current in a wire circumferential direction, a voltage based on rotation of the spins in the magneto-sensitive wire 1 is generated at the detection coil 3.

Figure 4:
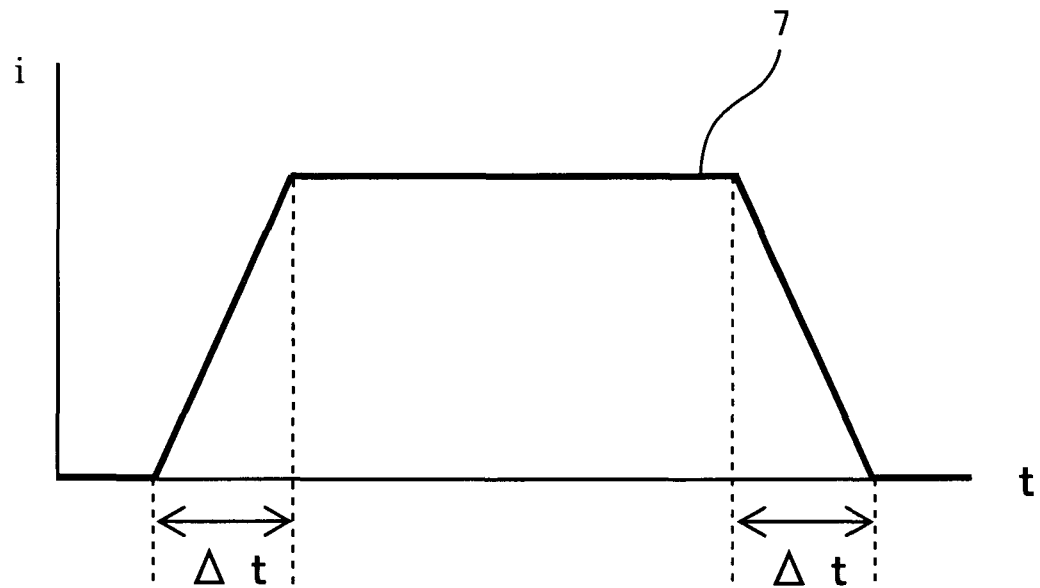
FIG. 4 are explanatory views illustrating how to calculate a frequency from a rise time or a fall time of pulse current used in an MI element or an MI sensor of the present invention.
Figure 4:
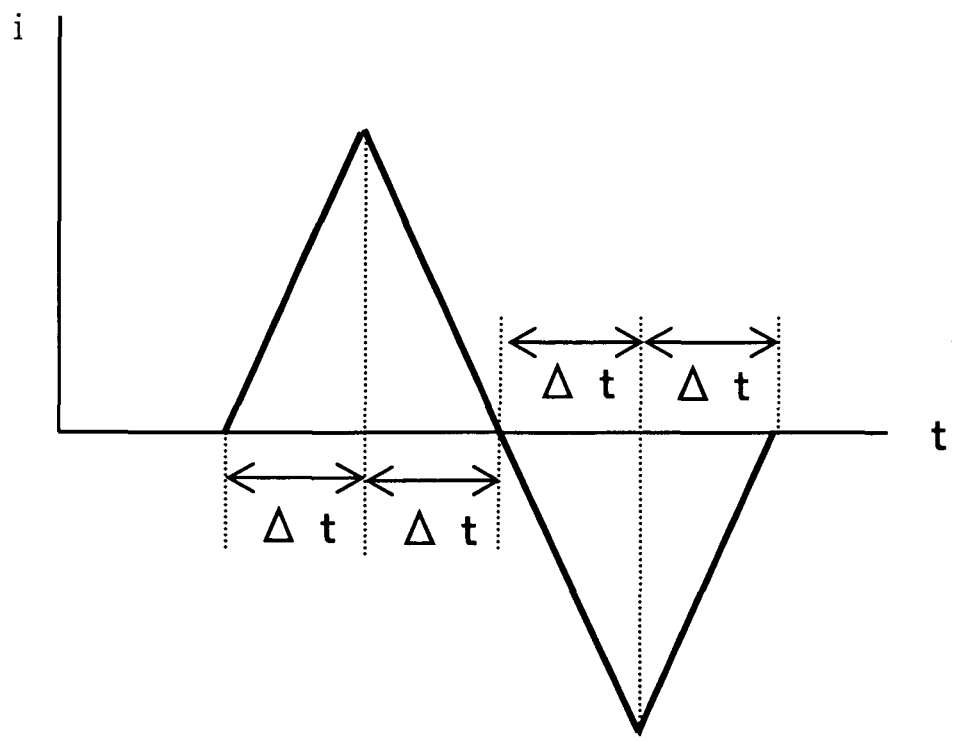

Frequency of this voltage is calculated by first obtaining a rise time or a fall time Δt in a pulse current waveform 7, as shown in FIG. 4(a), and then obtaining cycle time from the time Δt, assuming that the time Δt is one fourth of waveform cycle time, as shown in FIG. 4(b).

Next, after the abovementioned pulse current has risen, an analog switch 622 is switched (on and off) in a short time at a certain timing by a sample timing control circuit 621. This switching allows the analog switch 622 to sample a voltage corresponding to the external magnetic field and generated at the detection coil 3 and transmit the voltage to an amplifier 623. Similar operations are performed when the pulse current is interrupted (falls).

Constitution shown here is just an example and other known electric circuits for MI sensors can be employed.

<<Measurement>>

Magneto-impedance (MI) characteristics of this example was evaluated by placing the MI sensor 6 in magnetic fields of ±2400 A/m, 10 Hz and inputting pulse current of 80 mA corresponding to a frequency of 0.2 GHz to the magneto-sensitive wire 1 of the MI element 2, processing voltage signals generated at the detection coil 3 in the abovementioned signal processing circuit 62 to measure voltages of the respective magnetic fields output from the detection coil 3.

A rise time and a fall time of the pulse current were both 1.25 ns. Although voltage was detected by using the fall of pulse current, the voltage can be detected by using the rise or both the rise and the fall.

<<Evaluation>>

Figure 5:
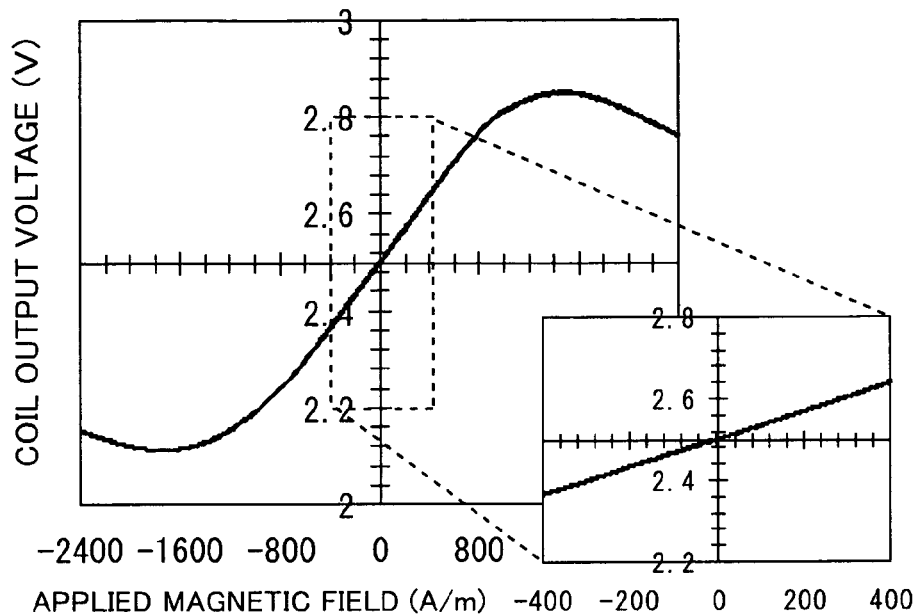
FIG. 5 are MI characteristic diagrams according to an example of the present invention and a conventional example.
Figure 5:
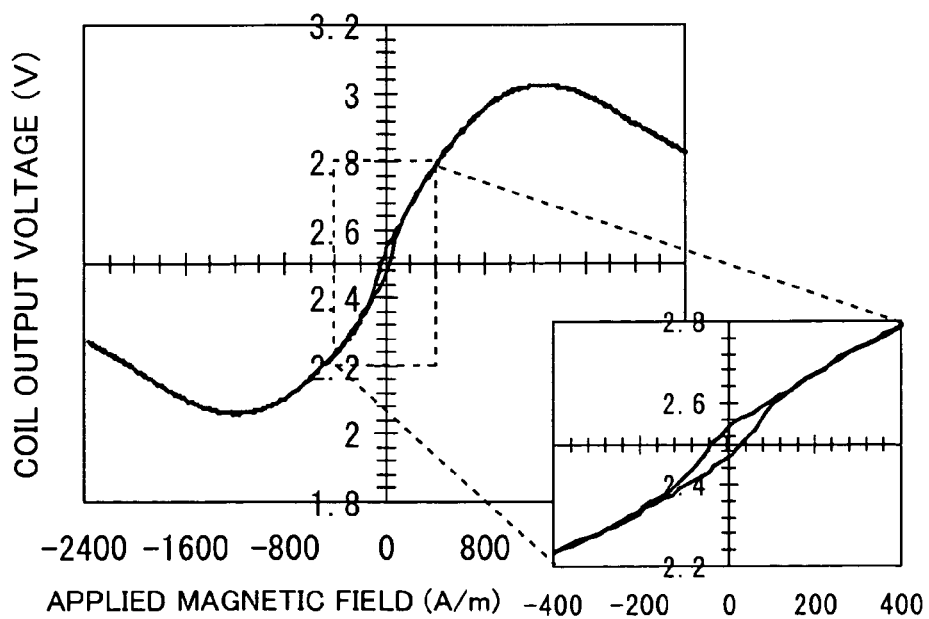

(1) Regarding the abovementioned Example 1 and the conventional example, results obtained by the abovementioned measurement are shown in FIG. 5 and Table 1. Measurement results of Example 1 are shown in FIG. 5($a$) and those of the conventional example are shown in FIG. 5($b$). In loops drawn in FIG. 5, a difference in applied magnetic field at a coil output voltage of 2.5 V was defined as hysteresis characteristics.

As apparent from the measurement results shown in FIG. 5($a$), Example 1 had hysteresis characteristics of 2 A/m, which was lower than detection power (7 A/m) of the detection device. This indicates that the hysteresis characteristics were almost zero. This demonstrates that the magneto-sensitive wire according to the present invention has a vortex spin structure having no magnetic wall.

On the other hand, as apparent from the measurement results shown in FIG. 5($b$), the conventional example had hysteresis characteristics of 33.4 A/m.

(2) Linearity is also an important parameter as one of practical performance of a magnetic sensor.

As apparent from the measurement results shown in FIG. 5($a$), Example 1 had a linearity of 0.7% F. S. in 30% of the applied magnetic field range showing peak voltages (in an applied magnetic field range of ±485 A/m in Example 1). This was not more than one tenth of linearity (7.7% F. S.) of the conventional example shown in FIG. 5($b$). Note that "F. S." stands for Full Scale.

It should be noted that evaluation of linearity was carried out here by evaluating linearity of output voltage with respect to applied magnetic field in 30% of the applied magnetic field range showing peak values of coil output voltage (in an applied magnetic field range of ±485 A/m in Example 1, and in an applied magnetic field range of ±377 A/m in the conventional example). The evaluation of linearity was carried out by the method No. 2623 of JIS B0155 in the respective measurement ranges.

(3) It was confirmed that an MI sensor using the magneto-sensitive wire according to Example 2 as well as the MI sensor using the magneto-sensitive wire according to Example 1 had good hysteresis characteristics (3 A/m), which was apparently different from those of the MI sensor using the conventional example, and the above-mentioned linearity (0.8% F. S.). This demonstrates that the magneto-sensitive wire according to Example 2 has a vortex spin structure having no magnetic domain wall.

<<The Present Invention>>

Based on the abovementioned embodiments or examples, constitution of the present invention can be more concretely expressed by the followings. It should be noted that the following description will be made with regard to a magneto-sensitive wire but will also be true with an MI element or an MI sensor.

(1) Alloy Composition

As mentioned above, preferably the magneto-sensitive wire comprises a Co—Si alloy, more preferably a Co—Si—B alloy and especially more preferably a Co—Fe—Si—B alloy, all having zero magnetostriction.

The Co—Fe—Si—B alloy may comprise, for example, 60 to 80 at % of Co, 3 to 7 at % of Fe, 5 to 20 at % of Si and 7 to 30 at % of B when the entire alloy composition is regarded as 100 at %. It is more preferable that the Co—Fe—Si—B alloy comprise 65 to 75 at of Co, 4 to 6 at of Fe, 7 to 15 at % of Si and 10 to 20 at of B. It should be noted that an upper limit value or a lower limit value of a compositional range of each element can be any value in the abovementioned numerical value ranges.

In addition to these elements, the magneto-sensitive wire of the present invention can contain a small amount of one or more reforming elements which do not harm the characteristics (vortex spin structure, hysteresis characteristics). Needless to say, the magneto-sensitive wire of the present invention can contain inevitable impurities.

(2) Thermal Treatment

Preferably, the magneto-sensitive wire of the present invention comprises an amorphous wire comprising an alloy having such composition as mentioned above. Upon applying appropriate thermal treatment to such an amorphous wire, not only a surface layer portion of the wire but also an inner portion of the wire can attain a vortex spin structure. Preferably, this thermal treatment is a thermal treatment in a temperature range where the amorphous wire is not completely crystallized, in an inert gas atmosphere or a vacuum atmosphere. Preferably, the heating temperature is, for example, 300 to 650 deg. C., 400 to 630 deg. C., or 500 to 600 deg. C. Preferably, the heating time is 2 to 60 seconds or 4 to 10 seconds. With this thermal treatment, it is preferable to apply tension to the wire. The purpose of this tension application is to cause internal stress in the amorphous wire.

Preferably, the tension to be applied is 30 to 2000 MPa, 100 to 1000 MPa or 100 to 400 MPa.

(3) Characteristics of Magneto-Sensitive Wire

First, it is preferable that the magneto-sensitive wire has hysteresis characteristics of not more than 7 A/m, not more than 5 A/m, or not more than 3 A/m. These levels can be regarded as substantially zero hysteresis.

Next, it is preferable that the magneto-sensitive wire has linearity of not more than 2% F. S., not more than 1.5% F. S., not more than 1% F. S., or not more than 0.8% F. S. in 30% of an applied magnetic field range specified by applied magnetic fields corresponding to peak voltages detected by the MI sensor.

It should be noted that "x to y" mentioned in the description of the present invention includes the lower limit value x and the upper limit value y, unless otherwise specified. The lower limit values and the upper limit values described in the description of the present invention can be combined arbitrarily to constitute such a range as "a to b". Moreover, the upper limit values or the lower limit values can be replaced with any numerical value in the described numerical value ranges.

INDUSTRIAL APPLICABILITY

Owing to almost zero hysteresis, a very small size and high sensitivity, the magneto-sensitive wire, the MI element and the MI sensor of the present invention are applicable to a micro magnetic sensor for small-sized electronic devices such as cellular phones.

TABLE 1

| | WIRE DIAMETER (μm) | MI CHARACTERISTICS | | MAGNETIC DOMAIN STRUCTURE |
| --- | --- | --- | --- | --- |
| | | HYSTERESIS CHARACTERISTIC (A/m) | LINEARITY (% F.S.) | |
| EX. 1 | 11.6 | 2 | 0.7 | VORTEX SPIN STRUCTURE |
| EX. 2 | 13 | 3 | 0.8 | VORTEX SPIN STRUCTURE |
| Conventional EX. | 20 | 33.4 | 7.8 | CIRCUMFERENTIAL ANISOTROPY + MULTI-MAGNETIC DOMAIN STRUCTURE |

The invention claimed is:

1. A magneto-sensitive wire having a vortex spin structure, wherein the vortex spin structure has a continuous spin alignment in which:
   respective spins in a radially-outer portion of the wire are continuously aligned in a circumferential direction,
   respective spins in a radially-inner portion of the wire are continuously aligned so as to gradually rotate from the circumferential direction to an axial direction as a location of the respective spins is closer to a longitudinal axis of the wire, and
   respective spins located on the longitudinal axis of the wire are oriented in the axial direction.

2. The magneto-sensitive wire according to claim 1, wherein the wire is configured such that no magnetic domain walls exist in the radially-inner portion of the wire, the radially-inner portion of the wire extending from the longitudinal axis thereof radially outward to a radius at which respective spins are continuously aligned in the circumferential direction.

3. The magneto-sensitive wire according to claim 1, comprising an amorphous soft magnetic alloy that has zero magnetostriction.

4. The magneto-sensitive wire according to claim 3, wherein the amorphous soft magnetic alloy is a Co—Si alloy containing cobalt (Co) and silicon (Si) as essential elements.

5. The magneto-sensitive wire according to claim 1, having a diameter of 0.5 to 15 μm.

6. A magneto-impedance element including the magneto-sensitive wire according to claim 1.

7. The magneto-impedance element according to claim 6, further comprising:
   a detection coil surrounding the magneto-sensitive wire,
   a pair of first electrodes connected to ends of the magneto-sensitive wire,
   a pair of second electrodes connected to ends of the detection coil.

8. The magneto-impedance sensor including the magneto-impedance element of claim 6.

9. The magneto-impedance sensor according to claim 8, further comprising:
   a pulse oscillation circuit configured to apply a high-frequency pulse current to the magneto-impedance element, and
   a signal processing circuit configured to detect an external magnetic field by detecting a voltage of the magneto-impedance element.

10. The magneto-impedance sensor according to claim 8, wherein the magneto-impedance element further includes:
    a detection coil surrounding the magneto-sensitive wire,
    a pair of first electrodes connected to ends of the magneto-sensitive wire, and
    a pair of second electrodes connected to ends of the detection coil.

11. A magneto-impedance sensor including the magneto-sensitive wire according to claim 1.

12. The magneto-sensitive wire according to claim 1, wherein a dimension of the wire along the longitudinal axis exceeds a diameter of the wire.

* * * * *